(12) United States Patent
Guillemenet et al.

(10) Patent No.: US 9,117,521 B2
(45) Date of Patent: Aug. 25, 2015

(54) MEMORY CELL WITH VOLATILE AND NON-VOLATILE STORAGE

(75) Inventors: Yoann Guillemenet, Crest (FR); Lionel Torres, Combaillaux (FR)

(73) Assignees: Centre National de la Recherche Scientifique (FR); Université Montpellier 2 (FR)

( * ) Notice: Subject to any disclaimer, the term of this patent is extended or adjusted under 35 U.S.C. 154(b) by 0 days.

(21) Appl. No.: 14/126,067

(22) PCT Filed: Jun. 14, 2012

(86) PCT No.: PCT/EP2012/061268
§ 371 (c)(1),
(2), (4) Date: May 30, 2014

(87) PCT Pub. No.: WO2012/171989
PCT Pub. Date: Dec. 20, 2012

(65) Prior Publication Data
US 2014/0269003 A1 Sep. 18, 2014

(30) Foreign Application Priority Data
Jun. 15, 2011 (FR) ...................................... 11 55192

(51) Int. Cl.
*G11C 11/00* (2006.01)
*G11C 13/00* (2006.01)
(Continued)

(52) U.S. Cl.
CPC .......... *G11C 13/0069* (2013.01); *G11C 11/161* (2013.01); *G11C 14/009* (2013.01); *G11C 14/0081* (2013.01); *G11C 13/0002* (2013.01)

(58) Field of Classification Search
CPC .................. G11C 11/4091; G11C 13/0002
USPC .............................................. 365/148, 205
See application file for complete search history.

(56) References Cited

U.S. PATENT DOCUMENTS 4,006,469 A 2/1977 Leehan et al.
5,973,965 A 10/1999 Berthold et al.
(Continued)

FOREIGN PATENT DOCUMENTS

EP 1134746 A2 9/2001
FR 2966636 A1 4/2012
(Continued)

OTHER PUBLICATIONS

Yamamoto, et al., "Nonvolatile Static Random Access Memory Using Resistive Switching Devices: Variable-Transconductance Metal Oxide Semiconductor Field-Effect-Transistor Approach", "Japanese Journal of Applied Physics", Apr. 1, 2010, pp. 40209-1 to 40209-3, vol. 49, No. 4, Publisher: Japan Society of Applied Physics, Published in: JP.
Officer: Jim Lindquist, "International Search Report for International Patent Application No. PCT/EP2012/061268," Dec. 17, 2012, Publisher: PCT, Published in: EP.
(Continued)

*Primary Examiner* — Michael Tran
(74) *Attorney, Agent, or Firm* — Kaplan Breyer Schwarz & Ottesen, LLP

(57) ABSTRACT

The invention concerns a non-volatile memory element comprising: first and second transistors (106, 108) forming an inverter (104) coupled between a first storage node (112) and an output (110) of the memory element; a third transistor (116) coupled between the first storage node (112) and a first supply voltage (GND, $V_{DD}$) and comprising a control terminal coupled to said output; a first resistance switching element (102) coupled in series with said third transistor and programmed to have one of first and second resistances ($R_{min}$, $R_{max}$) representing a non-volatile data bit; a fourth transistor (118) coupled between said storage node (112) a second supply voltage ($V_{DD}$, GND); and control circuitry (130) adapted to activate said third transistor at the start of a transfer phase of said non-volatile data bit to said storage node, and to control said fourth transistor to couple said storage node to said second supply voltage during said transfer phase.

16 Claims, 3 Drawing Sheets

(51) Int. Cl.
  G11C 11/16  (2006.01)
  G11C 14/00  (2006.01)

(56) References Cited

U.S. PATENT DOCUMENTS

| | | | |
|---|---|---|---|
| 6,172,899 | B1 | 1/2001 | Marr et al. |
| 7,495,945 | B2 | 2/2009 | Roehr |
| 7,760,538 | B1 | 7/2010 | Paak |
| 7,764,081 | B1 | 7/2010 | Tuan et al. |
| 7,796,417 | B1 | 9/2010 | Lewis |
| 8,605,490 | B2 | 12/2013 | Fackenthal |
| 8,773,896 | B2 | 7/2014 | Shukh |
| 2003/0161184 | A1 | 8/2003 | Lee et al. |
| 2004/0125643 | A1 | 7/2004 | Kang et al. |
| 2004/0141363 | A1 | 7/2004 | Ohtsuka et al. |
| 2006/0181916 | A1 | 8/2006 | Roehr |
| 2007/0041242 | A1 | 2/2007 | Okazaki et al. |
| 2008/0089146 | A1 | 4/2008 | Fujito et al. |
| 2009/0109734 | A1 | 4/2009 | Hanafi |
| 2009/0190409 | A1 | 7/2009 | Dittrich et al. |
| 2009/0268513 | A1 | 10/2009 | De Ambroggi et al. |
| 2010/0080042 | A1 | 4/2010 | Lamorey |
| 2010/0202191 | A1 | 8/2010 | Ahn et al. |
| 2010/0259975 | A1* | 10/2010 | Toda .................. 365/163 |
| 2010/0271866 | A1 | 10/2010 | Sakimura et al. |
| 2011/0085372 | A1 | 4/2011 | Fackenthal |
| 2011/0110142 | A1 | 5/2011 | Kitagawa et al. |
| 2011/0122709 | A1 | 5/2011 | Kim et al. |
| 2011/0208904 | A1 | 8/2011 | Fujito et al. |
| 2012/0001672 | A1* | 1/2012 | Barrow .................. 327/333 |
| 2013/0135008 | A1 | 5/2013 | Zhang et al. |
| 2014/0269003 | A1 | 9/2014 | Guillemenet et al. |

FOREIGN PATENT DOCUMENTS

| | | |
|---|---|---|
| FR | 2970589 A1 | 7/2012 |
| JP | 2003157671 A | 5/2003 |
| WO | 2007045202 A1 | 4/2007 |
| WO | 2008112746 A2 | 9/2008 |
| WO | 2010065691 | 6/2010 |

OTHER PUBLICATIONS

IBM , "Combined Single/Dual-Port Array Approach with 6-Device Cell," "IBM Technical Disclosure Bulletin," Jun. 1, 1988, pp. 291-292, vol. 31, No. 1, Publisher: IBM Corp., Published in: US.
Dylan C. White, "Non-Final Office Action," dated Dec. 29, 2014, issued in related U.S. Appl. No. 13/980,529.
Tan Nguyen, "Notice of Allowance," dated Jan. 21, 2015, issued in related U.S. Appl. No. 13/980,558.
Yoann Guillemenet et al, "A Non-Volatile Run-Time FPGA Using Thermally Assisted Switching MRAMS," pp. 421-426.
G. Grynkewich et al, "Nonvolatile Magnetoresistive Random-Access Memory Based on Magnetic Tunnel Junctions," Nov. 2014, pp. 818-821.
Zhao et al., "TAS-MRAM based Non-volatile FPGA logic circuit," Dec. 1, 2007, pp. 153-160, Publisher: International Conference on Field-Programmable Technology. ICFPT 2007. IEEE, XP031208385.
"International Preliminary Report on Patentability," dated Jul. 23, 2013, issued in related International Application No. PCT/EP2012/050800 (counterpart to related U.S. Appl. No. 13/980,529).
Guillemenet et al., "Related U.S. Appl. No. 13/980,529", filed Oct. 30, 2013, Publisher: USPTO.
Damien Czarik, "International Search Report," dated May 7, 2012, issued in related International Patent Application No. PCT/EP2012/050800 (counterpart to related U.S. Appl. No. 13/980,529).
"International Preliminary Report on Patentability," dated Jul. 23, 2013, issued in related International Application No. PCT/EP2012/050798 (counterpart to related U.S. Appl. No. 13/980,555).
Prenat et al., "Related U.S. Appl. No. 13/980,555", filed Nov. 22, 2013.

Damien Czarik, "International Search Report," dated Feb. 29, 2012, issued in related International Patent Application No. PCT/EP2012/050798 (counterpart to related U.S. Appl. No. 13/980,555).
"International Preliminary Report on Patentability," dated Jul. 23, 2013, issued in related International Application No. PCT/EP2012/050772 (counterpart to related U.S. Appl. No. 13/980,558).
"Supplemental Notice of Allowance," dated Dec. 4, 2014, issued in related U.S. Appl. No. 13/980,558.
Guillemenet et al., "Related U.S. Appl. No. 13/980,558", filed Oct. 30, 2013.
Nguyen, Tan, "Notice of Allowance, dated Jan. 21, 2015," issued in related U.S. Appl. No. 13/980,558.
Nguyen, Tan, "Notice of Allowance," dated Sep. 26, 2014, issued in related U.S. Appl. No. 13/980,558.
"International Search Report," dated Jul. 5, 2012, issued in related International Patent Application No. PCT/EP2012/050772.
Guillemenet et al., "Related U.S. Appl. No. 13/980,559", filed Nov. 21, 2013.
"International Preliminary Report on Patentability," dated Jul. 23, 2013, issued in related International Application No. PCT/EP2012/050767 (counterpart to related U.S. Appl. No. 13/980,559).
"International Search Report," dated May 7, 2012, issued in related International Patent Application No. PCT/EP2012/050767.
"French Search Report," dated Jun. 12, 2014, issued in related French Application No. 13/57536 (counterpart to related U.S. Appl. No. 14/446,044).
"International Preliminary Report on Patentability," dated Dec. 17, 2013, issued in related International Application No. PCT/EP2012/050798.
"Supplmental Notice of Allowance," dated Jan. 2, 2015, issued in related U.S. Appl. No. 14/126,051.
Di Pendina et al., "U.S. Appl. No. 14/446,044," filed Jul. 29, 2014.
Officer: Jim Lindquist, "International Search Report," dated Dec. 17, 2012, issued in related International Patent Application No. PCT/EP2012/061268 (counterpart to related U.S. Appl. No. 14/126,067).
"Notice of Allowance," dated Feb. 9, 2015, issued in related U.S. Appl. No. 14/126,051.
Di Pendina et al., "Related U.S. Appl. No. 14/324,110", filed Jul. 4, 2014.
Balaguer Lopez, J., "French Search Report," dated Mar. 7, 2014, issued in related French Patent Application No. 13/56637 (counterpart to related U.S. Appl. No. 14/324,110).
Guillaume et al., related "U.S. Appl. No. 14/395,555," filed Oct. 20, 2014.
Yue Zhang et al, "Compact Modeling of Perpendicular-Anisotrophy CoFeB/MgO Magnetic Tunnel Junctions," Mar. 2012, pp. 819-826, vol. 59, No. 3.
Balaguer Lopez, J., "European Search Report," dated Nov. 13, 2014, issued in corresponding EP Application No. 14175842.5 (counterpart to related U.S. Appl. No. 14/324,110).
Lionel Torres et al., "Evaluation of hybrid MRAM/CMOS cells for reconfigurable computing," Published in: FR.
Luqiao Liu, et al, "Magnetic switching by spin torque from the spin Hall effect," Published in: US.
Saied Tehrani, et al, "Magnetoresistive Random Access Memory Using Magnetic Tunnel Junctions," "Proceedings of the IEEE," May 2003, pp. 703-714, vol. 91, No. 5.
Ioan Mihai Miron et al, "Perpendicular switching of a single ferromagnetic layer induced by in-plane current injection," Aug. 11, 2011, pp. 189-194, vol. 476.
L. Q. Liu et al., "Spin-Torque Switching with the Giant Spin Hall Effect of Tantalum," 2012, vol. 336, No. 555.
I L Prejbeanu et al., "Thermally assisted MRAM," "Journal of Physics: Condensed Matter," Apr. 6, 2007, p. 23 Publisher: IOP Publishing, Published in: UK.
Sasikanth Manipatruni et al, "Voltage and Energy-Delay Performance of Giant Spin Hall Effect Switching for Magnetic Memory and Logic," pp. 1-16.
Guillemenet et al, Related "U.S. Appl. No. 14/126,051", filed Mar. 6, 2014.

\* cited by examiner

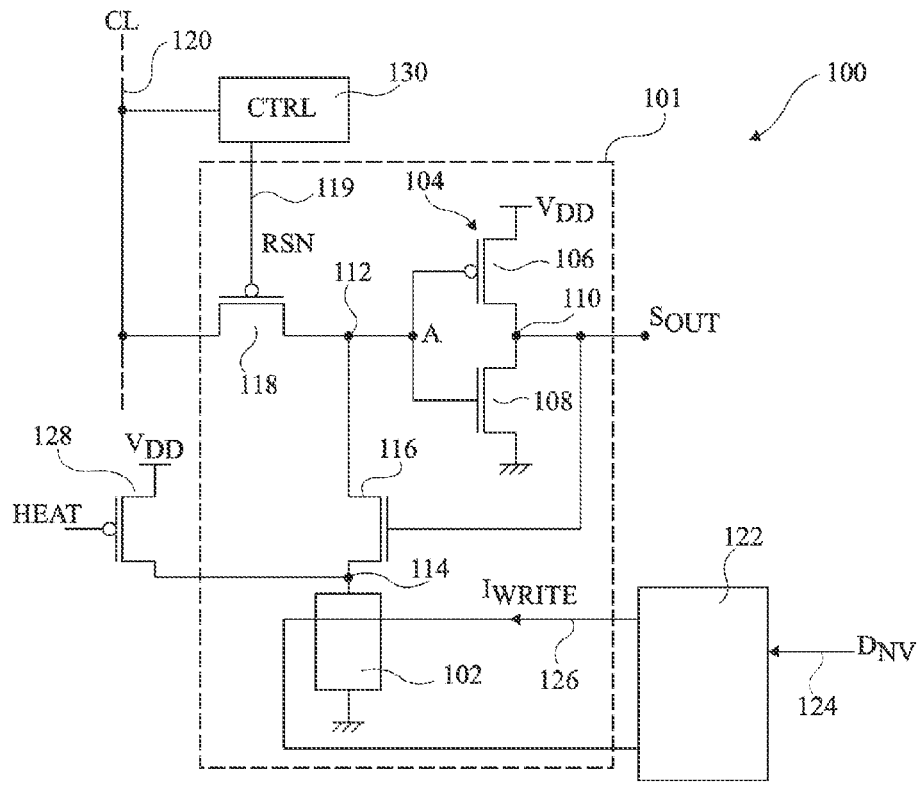
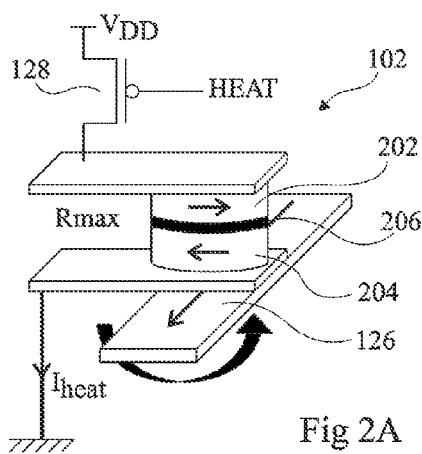
Fig 2A
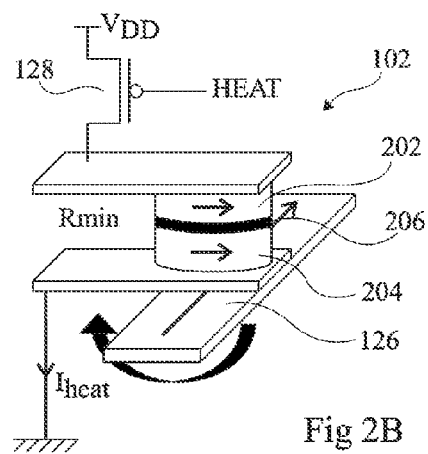
Fig 2B
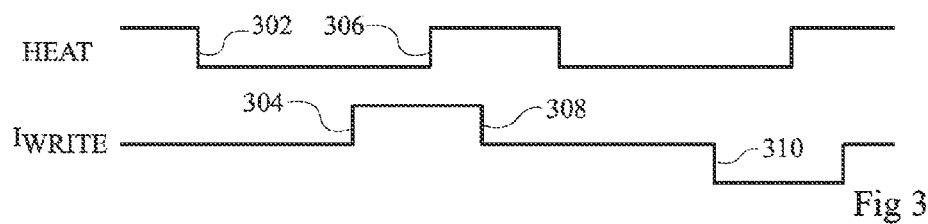
Fig 3

MEMORY CELL WITH VOLATILE AND NON-VOLATILE STORAGE

FIELD OF THE INVENTION

The present invention relates to a programmable non-volatile memory element, and to a method of reading one or more non-volatile bits from a programmable memory element.

BACKGROUND OF THE INVENTION

A data latch performs the role of storing a received digital data value, and providing this data value at an output. Generally, latches are implemented based on a pair of cross-coupled inverters, and are triggered by a clock pulse to capture the input data value. Combinations of latches can be used to implement more complex devices triggered by a clock edge, such as D-type flip-flops, SR (set reset) flip-flops, etc.

A drawback of existing latch circuits is that they are volatile devices, meaning that the stored data is lost if the supply voltage, which powers at least the inverters, is removed. This means that when the supply voltage is reapplied to a latch, the data to be stored by the latch must be loaded. In cases where there are many latches, this means performing many such load operations, which can be time and energy consuming.

In some applications, there is a need for a memory circuit that is able to provide an output data value without requiring such a load operation.

SUMMARY OF THE INVENTION

It is an aim of embodiments of the present invention to at least partially address one or more needs in the prior art.

According to one aspect of the present invention, there is provided a non-volatile memory element comprising: first and second transistors forming an inverter coupled between a first storage node and an output of the memory element; a third transistor coupled between the first storage node and a first supply voltage and comprising a control terminal coupled to said output; a first resistance switching element coupled in series with said third transistor and programmed to have one of first and second resistances representing a non-volatile data bit; a fourth transistor coupled between said storage node a second supply voltage; and control circuitry adapted to activate said third transistor at the start of a transfer phase of said non-volatile data bit to said storage node, and to control said fourth transistor to couple said storage node to said second supply voltage during said transfer phase.

According to one embodiment, the memory element further comprises a fifth transistor coupled between said first storage node and an input line for receiving a data bit to be stored at said first storage node.

According to another embodiment, said resistance switching element is coupled between said third transistor and said first supply voltage.

According to another embodiment, said resistance switching element is coupled between said fourth transistor and said second supply voltage.

According to another embodiment, the memory device further comprises programming circuitry adapted to program the resistances of said resistance switching element based on input data.

According to another embodiment, the memory device further comprises a fifth transistor coupled in series with said resistance switching element and adapted to heat said resistance switching element during a programming phase.

According to another embodiment, said fourth transistor is adapted to have a lower threshold voltage than said third transistor.

According to another embodiment, said first resistance switching element is one of: an oxide resistive element; a conductive bridging element; a phase change element; a programmable metallization element; a spin-torque-transfer element; a thermally assisted switching element and a field-induced magnetic switching element.

According to a further aspect of the present invention, there is provided a flip-flop comprising a pair of the above memory elements, wherein a first of said memory elements forming a master latch has its storage node coupled to a data input of said latch by a fifth transistor, and wherein a second of said memory elements forming a slave latch has its storage node coupled via a sixth transistor to said inverter of said first memory element.

According to one embodiment, said flip-flop further comprises an initialization transistor coupled between the gate terminal of said third transistor of said first memory element and said second supply voltage.

According to another embodiment, one of said pair of memory elements comprises its resistance switching element coupled between said third transistor and said first supply voltage and the other of said pair of memory elements comprises its resistance switching element coupled between said fourth transistor and said second supply voltage.

According to a further aspect of the present invention, there is provided a field programmable gate array comprising at least one multiplexer comprising an input coupled to at least one of the above memory elements or flip-flops.

According to yet a further aspect of the present invention, there is provided a field programmable gate array comprising: a plurality of configurable logic blocks; and at least one switching block adapted to interconnect said plurality of configurable logic blocks, wherein said at least one switching block comprises the above memory element or flip-flop.

According to yet a further aspect of the present invention, there is provided a method of transferring a data value from non-volatile storage of a memory element to a volatile storage node of said memory element, wherein the memory element comprises first and second transistors forming an inverter coupled between a storage node and an output of the memory element, a third transistor coupled between the storage node and a first supply voltage and comprising a control terminal coupled to said output, and a first resistance switching element coupled in series with said third transistor and programmed to have one of first and second resistances representing a non-volatile data bit, the method comprising: activating said third transistor; and coupling said storage node to a second supply voltage while said third transistor is activated.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which:

FIG. 1 illustrates a memory circuit according to an embodiment of the present invention;

FIGS. 2A and 2B schematically represent examples of the programming of a specific resistance switching element;

FIG. 3 is a timing diagram illustrating an example of the signals used for programming the non-volatile portion of the memory element of FIG. 1;

Throughout the figures, like features have been labelled with like reference numerals.

DETAILED DESCRIPTION OF EMBODIMENTS OF THE PRESENT DISCLOSURE

Figure 4:
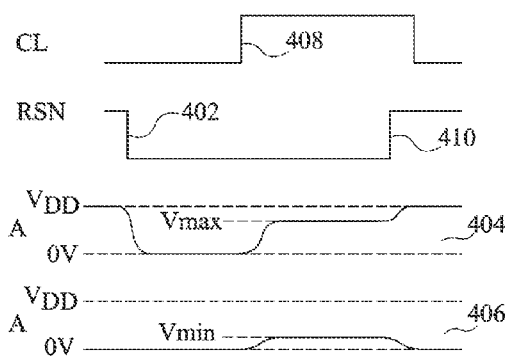
FIG. 4 is a timing diagram showing examples of signals in the memory element of FIG. 1.

FIG. 1 illustrates a memory circuit 100, comprising a memory element 101 that stores one bit of non-volatile data. This bit of non-volatile data is stored by the physical state of a resistance switching element 102, as will now be described.

The memory element 101 comprises an inverter 104 formed of a P channel MOS (PMOS) transistor 106 and an N channel MOS (NMOS) transistor 108 coupled in series between a supply voltage and a ground voltage. An intermediate node 110 between the transistors 106, 108 is also an output node of the latch, which provides an output signal $S_{OUT}$. The gates of transistors 106, 108 are coupled to a storage node 112, which stores a voltage A. Storage node 112 is coupled to the ground voltage via the series connection of an NMOS transistor 116 and the resistance switching element 102. The gate of transistor 116 is coupled to the output node 110. The storage node 112 is also coupled, via a PMOS transistor 118, to a control line 120, which may be a common control line coupled to more than one memory element 101, although only one memory element is shown in FIG. 1. When the PMOS transistor 118 is conducting, the control line 120 couples the storage node 112 to either the supply voltage $V_{DD}$, or to a ground voltage. The PMOS transistor 118 is controlled by a signal RSN provided on a line 119 to its gate node. Again, this signal may be common to a number of adjacent memory elements 101.

The resistance switching element 102 is any resistive element switchable between two resistance values. Such elements maintain the programmed resistive state even after a supply voltage is removed. The programmed resistive state of element 102 indicates one binary data value.

For example, the resistance switching element 102 is based on a magnetic tunnelling junction (MTJ), such as a field-induced magnetic switching (FIMS) element, thermally assisted switching (TAS) element, STT (spin-torque-transfer) element, or those of Toggle MRAM. FIMS-MRAM (magnetic random access memory) are for example discussed in more detail in the publication titled "Magnetoresistive random access memory using magnetic tunnel junctions", S. Tehrani, Proceedings of IEEE, 91(5):3707-714, May 2003. TAS-MRAM are for example discussed in more detail in the publication titled "Thermally Assisted MRAM", Prejbeanu et al.

Alternatively, the resistance switching element 102 could be another type of resistance switching memory device, including that used in programmable metallization cells (PMC), such as oxide resistive RAM (OxRRAM), conductive bridging RAM (CBRAM), or phase change RAM (PCRAM).

Whatever the type of resistance switching element, information is stored by setting its resistance to either a relatively high resistance ($R_{max}$) or a relatively low resistance ($R_{min}$). The exact values of $R_{min}$ and $R_{max}$ may vary depending on conditions such as temperature, process variations etc. The resistance element 102 is for example selected such that $R_{max}$ is always significantly greater than $R_{min}$, for example at least 20 percent greater. In general, the ratio between the resistance $R_{max}$ and the resistance $R_{min}$ is for example between 1.7 and 5 for an MRAM, or more generally between 1.2 and 10000. In one example, $R_{min}$ is in the region of 2.5 k ohms, and $R_{max}$ is in the region of 5 k ohms, although many other values are possible.

In operation, the resistance switching element 102 of the memory element 101 is programmed to have a desired resistance value indicating a data bit, as will be described in more detail below. Then, this data bit stored by the programmed state of element 102 can be transferred to the storage node 112 in the form of the voltage level A, in other words either a high or low logic level. This operation is also described in more detail below, and will be referred to herein as a non-volatile to volatile transfer phase, or simply data transfer phase. The transferred data will then be maintained at the storage node 112 while the supply voltage is present, and will be available at the output node 110.

A low state of the voltage A is maintained simply by the fact that transistor 116 is activated in this state, thereby coupling node 112 to ground via the element 102.

A high state of the voltage A at storage node 112 is maintained by leakage current passing through the PMOS transistor 118, from the control line 120, which is for example periodically charged to the supply voltage $V_{DD}$ during a standby state, to generate the leakage current.

The threshold voltage of the PMOS transistor 118 is lower than that of the NMOS transistor 116, such that when each is in the non-conducting state, the leakage current through transistor 118 is greater than the leakage current through transistor 116, thereby keeping the voltage A at node 112 at a voltage high enough to be seen as a high logic level. In other words, the leakage current $I_{offP}$ flowing through PMOS transistor 118 when a high voltage is applied to its gate node is greater that the leakage current $I_{offN}$ flowing through the NMOS transistor 116 when a low voltage is applied to its gate node. The particular threshold voltages will depend on the technology used. But as an example, the threshold voltage of PMOS transistor 118 is chosen to be in the range 0.3 to 0.5 V, while the threshold voltages of NMOS transistor 116 is chosen in the range 0.4 to 0.6 V. In any case, the ratio $I_{OffP}/I_{OffN}$ is selected for example to be greater than 25, and preferably greater than 100.

Programming of the resistance switching element 102 is performed by write control circuitry 122 of the memory circuit 100, based on a bit of non-volatile data $D_{NV}$ received on an input line 124 of the circuitry 122. The circuitry 122 generates a write current $I_{WRITE}$ based on the non-volatile data $D_{NV}$. This write current is provided on a conductive track 126 that passes by the resistance switching element 102, and causes a magnetic field to pass through the resistance switching element to program its resistive state.

In the case of thermally assisted switching MRAM, prior to supplying the write current to program the resistance switching element 102, it is heated by passing a current through it, which aids the transition from one resistive state to the other.

According to one example illustrated in FIG. 1, heat circuitry is provided that comprises a PMOS transistor 128 coupled between the supply voltage $V_{DD}$ and the resistance switching element 102. Transistor 128 is activated by a control signal "HEAT" at its gate terminal to conduct a current $I_{heat}$ that passes through and heats element 102 prior to programming.

FIGS. 2A and 2B show the resistance switching element 102 in more detail in the example it is a TAS element. Element 102 comprises a pinned ferromagnetic plate 202 and a free ferromagnetic plate 204, plates 202 and 204 sandwiching a tunnel oxide layer 206. The conductive track 126 passes close to the free plate 204 of ferromagnetic material, such that it is affected by the magnetic field generated by the current $I_{WRITE}$ flowing through track 126. The pinned plate 202 for example has a magnetic orientation in a first direction, while the magnetic orientation of plate 204 may be programmed, by the polarity of the current $I_{WRITE}$, to be in the same or opposite direction to that of plate 202. However, programming only occurs in elements that have already been heated.

FIG. 2A illustrates the case in which the magnetic orientations are in opposite directions in the plates 202, 204 due to first polarity of the current $I_{WRITE}$, resulting in a maximum resistance $R_{max}$ of the resistance switching element 102, for example in the range 2 k to 5 k Ohms.

FIG. 2B illustrates the case in which the magnetic orientations are in a same direction in the plates 202 and 204 due to a second polarity of the current $I_{WRITE}$, resulting in a minimum resistance $R_{min}$ of the resistance switching element 102, for example in the range of 100 to 3 k Ohms.

FIG. 3 is a timing diagram illustrating an example of the signals HEAT and $I_{WRITE}$ during the programming of the resistance switching element 102. The signal HEAT falls low at falling edge 302, thereby activating transistor 128. This generates a current $I_{HEAT}$ through element 102, and after a certain period, the signal $I_{WRITE}$ is asserted, as shown by the rising edge 304 of this signal. In the example of FIG. 3, at rising edge 304 the current becomes positive, which for example programs element 102 to be at a high resistance value $R_{max}$.

Next, the signal HEAT is brought high again by rising edge 306, such that the heating current $I_{HEAT}$ is stopped, and the resistance switching element 102 cools in its current resistive state. Then the signal $I_{WRITE}$ is brought low by a falling edge 308, to end the programming process. The subsequent transitions of the signals in FIG. 3 correspond to the programming of the opposite resistive state of element 102. Thus the signal $I_{WRITE}$ becomes negative by falling edge 310, rather than positive, to program the low resistive state.

In one example, the time during which the signal HEAT is active between edges 302 and 306 is around 20 ns. Thus a write operation can be achieved in little more than 35 ns. However, the heating and cooling-off times will vary based on factors such as the materials used, their volumes, etc., and also the heat currents that are applied, and thus the above values are given only as approximate examples.

The current $I_{WRITE}$ is for example in the region of 10 mA for programming one value of the data bit, or in the region of −10 mA for programming the opposite value of the data bit, although other values could be used.

The signal CL on the control line 120 and the signal RSN on the line 119 during the non-volatile to volatile transfer phase will now be described with reference to FIG. 4.

In general, the transfer phase comprises applying, by the control circuitry 130, a low voltage to the storage node 112 to ensure that transistor 116 is active, and then a high voltage, for example at or around the supply voltage $V_{DD}$, to generate a voltage A at the storage node that has a level dependent on the programmed state of the resistance switching element 102.

As shown in FIG. 4, a falling edge 402 of the RSN signal occurs while the signal CL on line 120 is at the ground voltage. Thus the storage node 112 is coupled to ground. In a first example curve 404 of the storage node voltage A, this causes the storage node voltage to drop from $V_{DD}$ to ground. In a second example curve 406 of the storage node voltage A, the storage node is already at ground, and thus there is no change. In either case, a low voltage at node 112 causes the output signal $S_{OUT}$ to go high, thereby ensuring that transistor 116 is activated.

Next, while the RSN signal is still low, the CL signal is brought high at a rising edge 408, for example to $V_{DD}$, such that the voltage at the storage node 112 rises. Because transistor 116 is initially conducting, this causes a current to flow from the control line 120 to ground via the transistors 118, 116 and the resistance switching element 102. A voltage divider is thus formed, and the voltage A at node 112 will depend on the programmed resistance of element 102. In the example curve 404, it is assumed that element 102 has been programmed to be at $R_{max}$, and in this case the storage node voltage A goes to a relatively high intermediate level $V_{max}$. In the example curve 406, it is assumed that element 102 has been programmed to be at $R_{min}$, and in this case the storage node voltage A goes to a relatively low intermediate level $V_{min}$. In general, the voltage A will reach a level equal to:

$$A = V_{DD} * [(R_{on116} + R_{102})/(R_{on118} + R_{on116} + R_{102})]$$

where $R_{on116}$ is the on resistance of transistor 116, $R_{on118}$ is the on resistance of transistor 118, and $R_{102}$ is the programmed resistance of element 102. These resistance values are chosen such that when $R_{102}$ is at $R_{min}$, the voltage A is lower than the threshold needed to cause the inverters output to go low, while when $R_{102}$ is at $R_{max}$, the voltage A is high than this threshold. This threshold voltage of the inverter is referred to herein as a metastability level $V_{meta}$. Thus, as shown in FIG. 4, in example curve 404, when the signal RSN goes high at rising edge 410, the voltage A goes to $V_{DD}$, while in example curve 406 the voltage A returns to ground after edge 410.

Figure 5A:
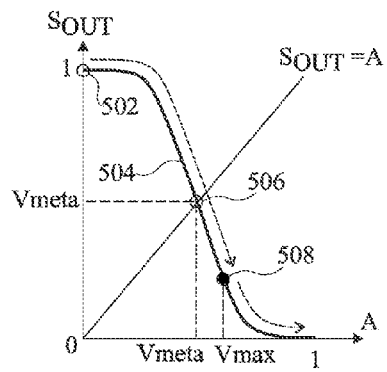
FIGS. 5A and 5B are graphs illustrating the transition between stable states of the memory element of FIG. 1 according to some embodiments of the present invention.
Figure 5B:
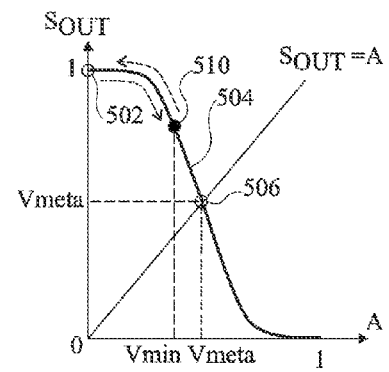

FIGS. 5A and 5B are graphs illustrating the state of the storage node 112 during a transfer phase.

Initially, given that the voltage A at storage node 112 is brought low, in both FIGS. 5A and 5B, the initial state 502 corresponds to the low A, high $S_{OUT}$ state.

In the case of FIG. 5A, the resistance of element 102 is at $R_{max}$, and thus when the signal CL goes high at edge 408 the voltage A at node 112 increases along a curve 504 and passes the metastability level 506 when it is equal to $V_{meta}$, before reaching a point 508 at which voltage A is at the level $V_{max}$ resulting from resistance $R_{max}$. Then, at rising edge 410, the storage node 112 goes to the closest stable state, which is the high A, low $S_{OUT}$ state.

In the case of FIG. 5B, the resistance of element 102 is at $R_{min}$, and thus when the signal CL goes high at edge 408 the voltage A at node 112 increase along the curve 504 but does not pass the point of metastability 506. Instead, it stops at a point 510 at which voltage A is at a level $V_{min}$ resulting from the resistance $R_{min}$. Then, at rising edge 410, the storage node 112 goes to the closest stable state, which is the low A, high $S_{OUT}$ state.

The values of the programmable resistances $R_{min}$ and $R_{max}$ of element 102 are for example chosen such that, when the supply voltage is applied to control line 120 with transistors 116 and 118 activated, the corresponding voltages $V_{min}$ and $V_{max}$ satisfy the relation $V_{min} < V_{meta} < V_{max}$, where $V_{meta}$ is the voltage corresponding to the point of metastability 506 of FIGS. 5A and 5B.

The memory element 101 of FIG. 1 permits the non-volatile storage of one data bit by element 102. This circuit could be adapted to also operate as a normal latch, storing and outputting a volatile data bit irrespective of the programmed state of resistance switching element 102. This can be achieved by the addition of a transistor coupled between node 112 and a data input line for receiving the volatile data bit, as will be described in more detail below with reference to the flip-flops of FIGS. 7A and 7B.

Figure 6:
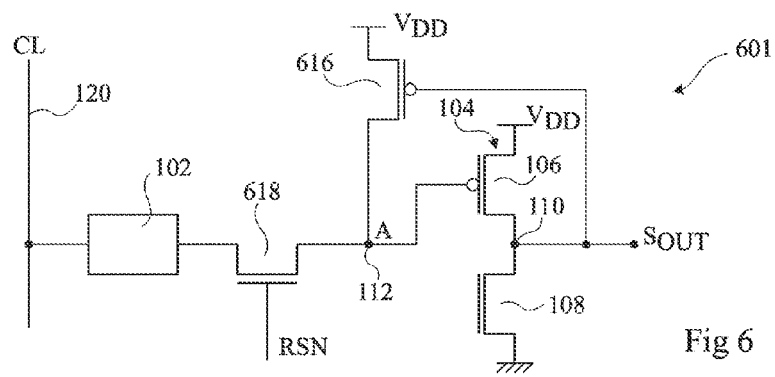
FIG. 6 illustrates a memory element according to a further embodiment of the present invention.

FIG. 6 illustrates a memory element 601, which is similar to the memory element 101 of FIG. 1, except that the NMOS transistor 116 is replaced by a PMOS transistor 616 coupled between the storage node 112 and the supply voltage $V_{DD}$, the PMOS transistor 118 is replaced by an NMOS transistor 618, and the resistance switching element 102 is coupled between transistor 618 and the control line 120. Operation of the circuit is very similar to that of memory element 101. Furthermore, elements similar to the write control block 122, heat transistor 128, and control circuitry 130 could be used during write and transfer phases. However, a difference is that the heat transistor is for example coupled between ground and a node between element 102 and transistor 618, and is activated at the same time as a high voltage is applied to control line 120 to heat element 102. Furthermore, during a standby phase, a low state at the storage node 112 is maintained by choosing the threshold voltages of transistors 616, 618 such that the leakage current $I_{offN}$ flowing through NMOS transistor 618 when a low voltage is applied to its gate node is greater that the leakage current $I_{offP}$ flowing through the PMOS transistor 616 when a high voltage is applied to its gate node. Also, transistor 618 is activated by a high voltage at its gate terminal. During a transfer phase, a high level is initially written to the storage node 112, such that transistor 616 is activated, and then the storage node is coupled to the ground voltage via the control line 120, such that a potential divider is formed by transistors 616 and 618 and element 102.

As with the memory element 101 of FIG. 1, the memory element 601 could be adapted to store a volatile data bit, in addition to the non-volatile data bit stored by resistance switching element 102, by the addition of a further transistor coupled between storage node 112 and a data input line for receiving the volatile data bit, as will be described in more detail below with reference to the flip-flops of FIGS. 7A and 7B.

Figure 7A:
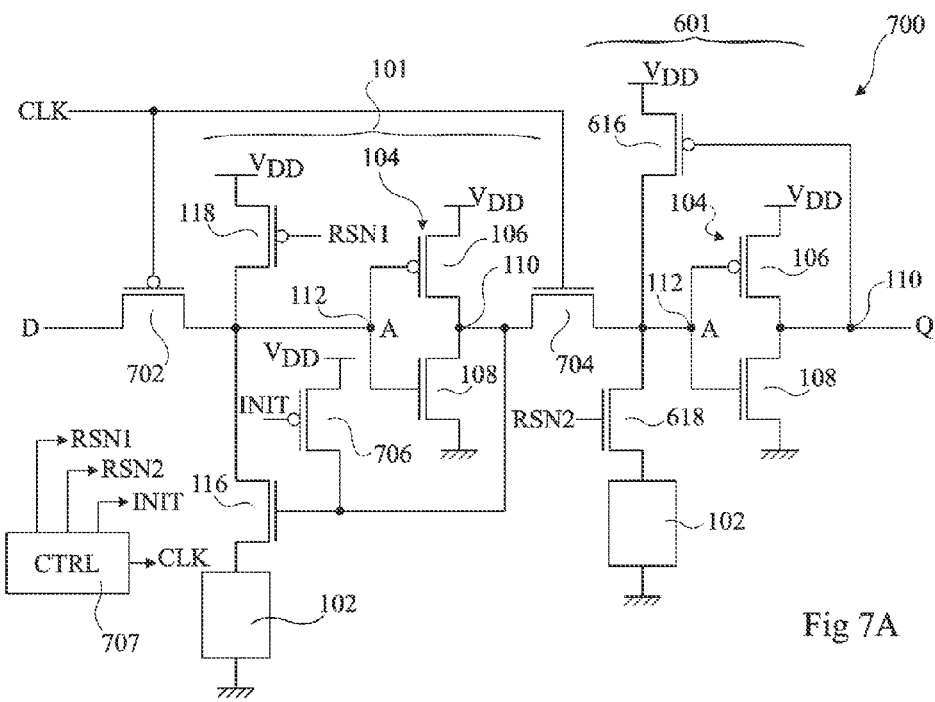
FIGS. 7A and 7B illustrate flip-flop circuits according to further embodiments of the present invention.

FIG. 7A illustrates a flip-flop 700 comprising a pair of memory elements. In the example of FIG. 7A, the flip-flop 700 comprises a master latch formed of the memory element 101 of FIG. 1 having its storage node 112 coupled to a data input of the flip-flop via a PMOS transistor 702, and its PMOS transistor 118 coupled to the supply voltage $V_{DD}$. A PMOS transistor 706 is also provided coupled between node 110 and the supply voltage $V_{DD}$ for performing an initialization of the storage node voltage A, as will be described below. Furthermore, flip-flop 700 comprises a slave latch comprising the memory element 601 of FIG. 6 having its storage node 112 coupled to the output node 110 of memory element 101 via an NMOS transistor 704, and its resistive switching element 102 coupled between transistor 618 and ground. The output node 110 of element 601 provides the Q output of the flip-flop 700. Transistors 702, 704 receive at their gate nodes a clock signal CLK. A control block 707 provides the clock signal CLK to transistors 702, 704 and the control signals RSN1, RSN2 and INIT to the gates of transistors 118, 618 and 706 respectively.

In normal operation, transistors 118 and 706 of memory element 101 and transistor 618 of memory element 601 are not conducting. During the normal operation, the data signal D present at the data input of the flip-flop 700 is stored at the storage node 112 of element 101 after the falling edge of the clock signal CLK, and on the subsequent rising edge of the clock signal CLK the inverse of this data value is propagated to the storage node 112 of element 601, causing the Q output of the flip-flop to become equal to this data value. During a standby phase, the voltage at the storage node 112 of memory elements 101, 601 is maintained. In particular, the high state at the storage node 112 of element 101 is ensured by an off current flowing through transistor 118, which is greater than the off current through transistor 116, and the low state at the storage node 112 of element 601 is ensured by an off current flowing through transistor 616, which is smaller than the off current through transistor 618.

The programming of the resistance switching elements 102 of memory elements 101, 601 can be performed in the same way as described above with reference to FIGS. 1 and 6.

At any time, the non-volatile data stored by the programmed state of the resistance switching element of either of the memory elements 101, 601 may be transferred to the corresponding storage node 112 and then to the Q output of the flip-flop, as will now be described.

To transfer the non-volatile data of the resistance switching element 102 of memory element 101, the clock signal CLK is brought high, such that PMOS 702 is non-conducting and NMOS 704 is conducting. Then, an initialisation of the voltage A at the storage node 112 is performed by activating PMOS transistor 706, thereby turning on transistor 116. Then, the PMOS transistor 118 is activated by a low voltage of its gate signal RSN1. The level at node 112 of memory element 101 is thus based on the programmed resistance of element 102, due to a potential divider formed by transistors 118, 116 and element 102. As transistor 704 is conducting, the data value is propagated directly to the Q output of the flip-flop 700.

The on resistance of PMOS 118 is for example chosen to be greater than the on resistance of PMOS 702. In this way, when node 112 of memory element 101 is at a low voltage and transistor 116 is conducting, the writing of a high data value D to the storage node 112 will still be successful when the resistive switching element 102 has been programmed with minimum resistance $R_{min}$. In particular, the following equations for example hold:

$$V_{DD}*[(R_{on116}+R_{min})/(R_{on702}+R_{on116}+R_{min})]>V_{meta}$$

$$V_{DD}*[(R_{on116}+R_{min})/(R_{on118}+R_{on116}+R_{min})]<V_{meta}$$

where $R_{on116}$, $R_{on702}$ and $R_{on118}$ are on resistances of transistors 116, 702 and 118 respectively, and $V_{meta}$ is the metastability voltage of the inverter 104 of memory element 101.

To transfer the data stored by element 601 to the Q output of flip-flop 700, a similar process is performed, except that the voltage at storage node 112 is first initialized to $V_{DD}$ by activating transistor 706 while the clock signal CLK is high. During the subsequent transfer phase, the clock signal CLK is low. The signal RSN2 is brought high to activate transistor 618, and due to the potential divider formed by transistors 616, 618 and resistance switching element 102, the voltage A at storage node 112 of element 601 depends on the programmed resistance of element 102. The Q output of the flip-flop 700 then takes the corresponding voltage.

Figure 7B:
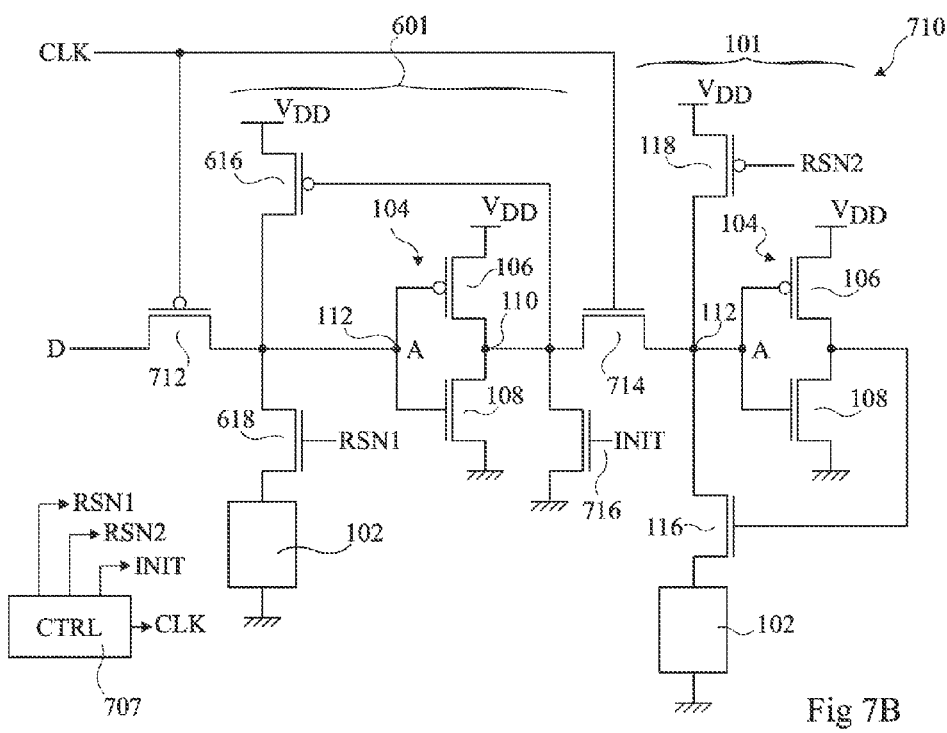

FIG. 7B illustrates a flip-flop 710 according to an alternative embodiment in which the master latch is formed by the memory element 601 and the slave latch is formed by the memory element 101. Furthermore, with respect to the embodiment of FIG. 7A, in FIG. 7B the PMOS transistor 702 is replaced by an NMOS transistor 712, and the NMOS transistor 704 is replaced by a PMOS transistor 714. Also, the PMOS initialization transistor 706 is replaced by an NMOS transistor 716 coupled between output node 110 of memory element 601 and ground.

The operation of the flip-flop 710 is similar to that of flip-flop 700, except that the output is triggered by a falling rather than rising edge of the clock signal CLK. Furthermore, to transfer the data programmed by the resistance switching element 102 of memory element 601, the voltage of storage node 112 is first initialized to a high level, and then transistor 618 is activated by a high voltage while the clock signal CLK is low. The transfer of data programmed by the resistance switching element 102 of memory element 101 is transferred after initializing the storage node 112 of memory element 101 to a low level by activating transistor 716 while the clock signal CLK is low, and then the PMOS transistor 118 is activated while the clock signal CLK is high.

Figure 8A:
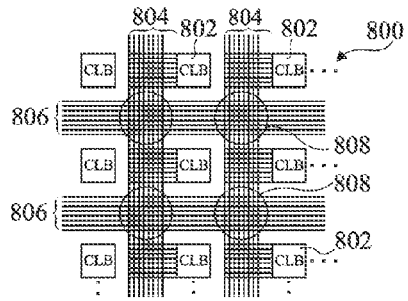
FIG. 8A illustrates a field programmable gate array according to a further embodiment of the present invention.

FIG. 8A illustrates an FPGA (field programmable gate array) 800 in which the memory elements 101, 601 and/or flip-flops 700, 710 described herein may be implemented. The FPGA comprises an array of configurable logic blocks (CLB) 802 selectively interconnected by columns of lines 804, which in turn are selectively interconnected with rows of lines 806. In particular, switch blocks 808 are provided at each intersection between column lines 804 and row lines 806, allowing the connections between the each of the column lines 804 with each of the row lines 806 to be programmed. The switching blocks 808 for example comprise one or more of the memory elements 101, 601, and/or flip-flips 700, 710 allowing the connections between the lines to be programmed in a non-volatile fashion. Furthermore, in the case that the flip-flop 700, 710 is used to program the connections, one of a plurality of connection configurations may be selected by selecting which of the non-volatile data bits programmed by the resistive states of the two resistance switching elements 102 is transferred to the Q output.

Figure 8B:
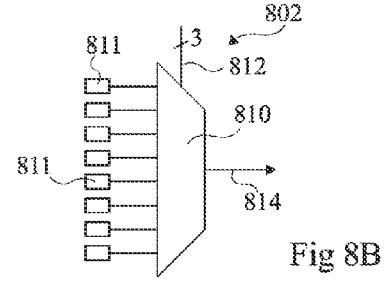
FIG. 8B illustrates a configurable logic block of the FPGA of FIG. 8A in more detail according to an embodiment of the present invention.

FIG. 8B illustrates one of the CLB 802 in more detail according to one example in which it comprises a look-up table formed of a multiplexer 810 having 8 data inputs, each of which is coupled to a memory cell 811, which could be the memory element 101 or 601 or the flip-flop 700, 710. In alternative embodiments, there could be any number of these cells and inputs to the multiplexer 810. The multiplexer 810 also comprises a 3-bit control input 812, controlling which of the 8 input lines is selected, and an output line 814, outputting the data of the selected input line.

An advantage of the embodiments of the memory elements described herein is that it is capable of storing non-volatile data in a simple and compact fashion, and that the programmed non-volatile data can be quickly loaded to the volatile portion of the memory element by application of a voltage to the access lines of the memory element. This advantageously means that a state programmed in a non-volatile fashion may be quickly loaded (in less than 1 ns), for example upon activation of the memory on power-up or after a sleep period. In the case of an FPGA, this allows a circuit design to be quickly initialised, without the need of loading external data into the device to program memory latches and switches.

Furthermore, advantageously in the case of the flip-flops 700, 710, the volatile storage portions may be used in a standard fashion irrespective of the programmed states of the non-volatile resistive elements. Furthermore, the write time for the non-volatile portion is also relatively fast, for example around 35 ns in the case of an MRAM.

Having thus described at least one illustrative embodiment of the invention, various alterations, modifications and improvements will readily occur to those skilled in the art.

For example, it will be apparent to those skilled in the art that, while the invention has been described in relation to flip-flops 700, 710 and an FPGA, the memory elements described herein could be used in other types of memory devices.

Furthermore, in the case of the flip-flops 700, 710, it will be apparent that rather than both the master and slave latches comprising resistive-switching elements 102, in alternative embodiments the element 102 could be removed from one of the latches.

It will be apparent to those skilled in the art that the ground voltage described herein may be at 0 V, or more generally at any supply voltage $V_{SS}$, that could be different from 0 V.

Furthermore, it will be apparent to those skilled in the art that the various transistors described herein could be implemented by NMOS or PMOS devices, and that the MOS transistors could alternatively be implemented by other transistor technologies, such as bipolar technology.

Furthermore, the features described in relation to the various embodiments could be combined in alternative embodiments in any combination.

The invention claimed is:

1. A non-volatile memory element comprising:
   first and second transistors forming an inverter coupled between a first storage node and an output of the memory element;
   a third transistor coupled between the first storage node and a first supply voltage and comprising a control terminal coupled to said output;
   a first resistance switching element coupled in series with said third transistor and programmed to have one of first and second resistances representing a non-volatile data bit;
   a fourth transistor coupled between said first storage node and a second supply voltage; and
   control circuitry adapted to activate said third transistor at the start of a transfer phase of said non-volatile data bit to said first storage node, and to control said fourth transistor to couple said first storage node to said second supply voltage during said transfer phase.

2. The memory element of claim 1, further comprising a fifth transistor coupled between said first storage node and an input line for receiving a data bit to be stored at said first storage node.

3. The memory element of claim 1, wherein said resistance switching element is coupled between said third transistor and said first supply voltage.

4. The memory element of claim 1, wherein said resistance switching element is coupled between said fourth transistor and said second supply voltage.

5. The memory device of claim 1, further comprising programming circuitry adapted to program the resistances of said resistance switching element based on input data.

6. The memory device of claim 5, further comprising a fifth transistor coupled in series with said resistance switching element, and adapted to heat said resistance switching element during a programming phase.

7. The memory device of claim 1, wherein said fourth transistor is adapted to have a lower threshold voltage than said third transistor.

8. The memory device of claim 1, wherein said first resistance switching element is one of:
   an oxide resistive element;
   a conductive bridging element;
   a phase change element;
   a programmable metallization element;
   a spin-torque-transfer element;

a thermally assisted switching element and a field-induced magnetic switching element.

9. A flip-flop comprising a pair of memory elements, each of the memory elements comprising the memory element of claim 1, wherein a first of said memory elements forming a master latch has its storage node coupled to a data input of said latch by a fifth transistor, and wherein a second of said memory elements forming a slave latch has its storage node coupled via a sixth transistor to said inverter of said first memory element.

10. The flip-flop of claim 9, wherein said flip-flop further comprises an initialization transistor coupled between the gate terminal of said third transistor of said first memory element and said second supply voltage.

11. The flip-flop of claim 9, wherein one of said pair of memory elements comprises its resistance switching element coupled between said third transistor and said first supply voltage and the other of said pair of memory elements comprises its resistance switching element coupled between said fourth transistor and said second supply voltage.

12. A field programmable gate array comprising at least one multiplexer comprising an input coupled to the memory element of claim 1.

13. A field programmable gate array comprising:
a plurality of configurable logic blocks; and
at least one switching block adapted to interconnect said plurality of configurable logic blocks, wherein said at least one switching block comprises the memory element claim 1.

14. A method of transferring a data value from non-volatile storage of a memory element to a volatile storage node of said memory element, wherein the memory element comprises first and second transistors forming an inverter coupled between a storage node and an output of the memory element, a third transistor coupled between the storage node and a first supply voltage and comprising a control terminal coupled to said output, a fourth transistor coupled between said storage node and a second supply voltage, and a first resistance switching element coupled in series with said third transistor and programmed to have one of first and second resistances representing a non-volatile data bit, the method comprising:
activating said third transistor; and
coupling said storage node to a second supply voltage while said third transistor is activated.

15. A field programmable gate array comprising at least one multiplexer comprising an input coupled to the flip-flop of claim 9.

16. A field programmable gate array comprising:
a plurality of configurable logic blocks; and
at least one switching block adapted to interconnect said plurality of configurable logic blocks, wherein said at least one switching block comprises a flip-flop of including a pair of memory elements, each of the memory elements comprising a non-volatile memory element comprising:
first and second transistors forming an inverter coupled between a first storage node and an output of the memory element;
a third transistor coupled between the first storage node and a first supply voltage and comprising a control terminal coupled to said output;
a first resistance switching element coupled in series with said third transistor and programmed to have one of first and second resistances representing a non-volatile data bit;
a fourth transistor coupled between said first storage node and a second supply voltage; and
control circuitry adapted to activate said third transistor at the start of a transfer phase of said non-volatile data bit to said first storage node, and to control said fourth transistor to couple said first storage node to said second supply voltage during said transfer phase;
wherein a first of said memory elements forming a master latch has its storage node coupled to a data input of said latch by a fifth transistor, and wherein a second of said memory elements forming a slave latch has its storage node coupled via a sixth transistor to said inverter of said first memory element.

* * * * *